(12) United States Patent
Naito

(10) Patent No.: US 9,956,886 B2
(45) Date of Patent: May 1, 2018

(54) SHIELDED WIRE AND COMMUNICATION SYSTEM

(71) Applicant: TOYOTA JIDOSHA KABUSHIKI KAISHA, Toyota-shi, Aichi-ken (JP)

(72) Inventor: Takayuki Naito, Okazaki (JP)

(73) Assignee: TOYOTA JIDOSHA KABUSHIKI KAISHA, Toyota-shi, Aichi-ken (JP)

( * ) Notice: Subject to any disclaimer, the term of this patent is extended or adjusted under 35 U.S.C. 154(b) by 0 days. days.

(21) Appl. No.: 15/079,199

(22) Filed: Mar. 24, 2016

(65) Prior Publication Data

US 2016/0284444 A1 Sep. 29, 2016

(30) Foreign Application Priority Data

Mar. 26, 2015 (JP) ................... 2015-064511

(51) Int. Cl.
  *H02J 7/00* (2006.01)
  *H04B 3/54* (2006.01)
  *B60L 11/18* (2006.01)
  *H05K 7/14* (2006.01)
  *H05K 9/00* (2006.01)

(52) U.S. Cl.
  CPC ........... *B60L 11/1851* (2013.01); *H02J 7/00* (2013.01); *H04B 3/54* (2013.01); *H05K 7/1432* (2013.01); *H05K 9/0098* (2013.01); *H04B 3/542* (2013.01); *H04B 2203/5416* (2013.01); *Y02T 10/7005* (2013.01); *Y02T 10/705* (2013.01); *Y02T 90/16* (2013.01)

(58) Field of Classification Search
  CPC .................... H01R 4/64; H05K 9/00
  USPC .............................. 174/102 R, 350
  See application file for complete search history.

(56) References Cited

U.S. PATENT DOCUMENTS

| 4,264,940 | A | * | 4/1981 | Castle | H02H 9/04 333/12 |
| 4,599,483 | A | * | 7/1986 | Kuhn | H01B 11/08 174/103 |
| 5,491,299 | A | * | 2/1996 | Naylor | A61B 5/04286 174/105 R |
| 5,569,158 | A | * | 10/1996 | Suzuki | A61B 1/00114 348/76 |
| 6,395,977 | B1 | * | 5/2002 | Yamamoto | H01R 24/44 174/36 |
| 7,208,684 | B2 | * | 4/2007 | Fetterolf, Sr. | H01B 7/225 174/113 R |
| 2013/0032393 | A1 | | 2/2013 | Toyama | |
| 2015/0083459 | A1 | * | 3/2015 | Nagahashi | H01B 9/04 174/107 |

(Continued)

FOREIGN PATENT DOCUMENTS

| JP | 61120119 U | 7/1986 |
| JP | 0382098 A | 4/1991 |

(Continued)

*Primary Examiner* — Timothy Thompson
*Assistant Examiner* — Michael F McAllister
(74) *Attorney, Agent, or Firm* — Sughrue Mion, PLLC

(57) ABSTRACT

A shielded wire is connected to a high-voltage system and conducting high-voltage communication. The shielded wire includes a wire section and a first shielding layer. The first shielding layer covers the wire section. The first shielding layer is grounded to the high-voltage system or an object with the same potential as the high-voltage system.

12 Claims, 13 Drawing Sheets

(56) References Cited

U.S. PATENT DOCUMENTS

| | | | |
|---|---|---|---|
| 2015/0246647 A1* | 9/2015 | Sugino | B60R 16/0215 174/102 R |
| 2015/0366111 A1* | 12/2015 | Yagi | H02M 1/44 174/350 |
| 2016/0165765 A1* | 6/2016 | Yamada | H02G 3/0481 174/350 |

FOREIGN PATENT DOCUMENTS

| | | |
|---|---|---|
| JP | 2011165356 A | 8/2011 |
| JP | 2012-134367 A | 7/2012 |
| JP | 2013-109919 A | 6/2013 |
| WO | 2013035176 A1 | 3/2013 |

* cited by examiner

SHIELDED WIRE AND COMMUNICATION SYSTEM

INCORPORATION BY REFERENCE

The disclosure of Japanese Patent Application No. 2015-064511 filed on Mar. 26, 2015 including the specification, drawings and abstract is incorporated herein by reference in its entirety.

BACKGROUND

1. Field

The present disclosure relates to a shielded wire and a communication system.

2. Description of Related Art

A shielded wire such as that disclosed in Japanese Patent Application Publication No. 2013-109919 (JP 2013-109919 A) has been known. In general, the shielded wire that is connected to a high-voltage system or a low-voltage system includes a wire section, a shielding layer for covering the wire section, and a sheath for covering the shielding layer.

When the sheath is peeled from a tip of the shielded wire, the shielding layer is exposed. A ground terminal is attached to a tip of the shielding layer (also referred to as a drain wire). A ground connection is made when the ground terminal is fixed to a metal plate, a vehicle body, or the like. Meanwhile, a wire is exposed in a portion from which the sheath and the shielding layer are skinned. A connection terminal is attached to the wire (a core wire), and the connection terminal is connected to an electrical component that is accommodated in a shielding case or the like.

In general, the shielding layer of the shielded wire is subjected to the ground connection via the drain wire. Here, it is assumed that the shielding layer of the shielded wire (high-voltage wiring), which is connected to the high-voltage system, is subjected to the ground connection and that the shielding layer of the shielded wire (low-voltage wiring), which is connected to the low-voltage system, is also subjected to the ground connection. According to this structure, communication performance of the low-voltage wiring can be secured.

Here, a reference potential that is used for high-voltage communication is sufficiently higher than a reference potential that is used for low-voltage communication. A potential variation value between the potential that is used for the high-voltage communication and a ground potential differs from a potential variation value between the potential that is used for the low-voltage communication and the ground potential. Thus, a large potential variation difference is generated between the high-voltage wiring and the low-voltage wiring (the ground potential). In the case where the high-voltage wiring and the low-voltage wiring (or the ground potential) are arranged near each other, due to coupling of stray capacitances, filters, or the like, the potential variation difference between a communication reference wire of the high-voltage wiring and the low-voltage wiring (or the ground potential) is possibly superposed as noise on the high-voltage wiring, and thus the high-voltage communication does not possibly function normally.

SUMMARY

The present disclosure provides a shielded wire that can suppress noise from being superposed on the shielded wire (high-voltage wiring) connected to a high-voltage system and a communication system that includes such a shielded wire.

In an aspect of the present disclosure, a shielded wire related to the present disclosure is connected to a high-voltage system and conducting high-voltage communication. The shielded wire includes a wire section and a first shielding layer. The first shielding layer covers the wire section. The first shielding layer is grounded to the high-voltage system or a portion with the same potential as the high-voltage system.

According to the above configuration, the shielding layer of the shielded wire (high-voltage wiring) that is connected to the high-voltage system is grounded to the portion with the same potential as the high-voltage system. A potential variation difference between a communication reference wire of the high-voltage wiring and a shield ground section becomes smaller than a potential variation difference in the case where ground connection of a shielding layer of the high-voltage wiring is made. Accordingly, noise that is generated as a result of the potential variation difference is suppressed, and communication performance of the high-voltage wiring can further be secured. That is, according to the above configuration, it is possible to suppress noise from being superposed on the shielded wire (the high-voltage wiring) that is connected to the high-voltage system.

The shielded wire may further includes a second shielding layer. The second layer covers the first shielding layer. The second shielding layer is grounded to a low-voltage system or a portion with the same potential as the low-voltage system.

According to the above configuration, communication performance of low-voltage wiring can also be secured.

In another aspect of the present disclosure, a communication system related to the present disclosure includes a high-voltage system, a low-voltage system and a shielded wire. The low-voltage system is arranged near the high-voltage system. The shielded wire is connected to the high-voltage system and includes a wire section and a first shielding layer. The first shielding layer covers the wire section and being grounded to the high-voltage system or a portion with the same potential as the high-voltage system.

According to the above configuration, the communication system including the shielded wire that can suppress the noise from being superposed on the shielded wire (the high-voltage wiring) that is connected to the high-voltage system can be obtained.

BRIEF DESCRIPTION OF THE DRAWINGS

Features, advantages, and technical and industrial significance of exemplary embodiments will be described below with reference to the accompanying drawings, in which like numerals denote like elements, and wherein.

DETAILED DESCRIPTION OF EMBODIMENTS

Figure 1:
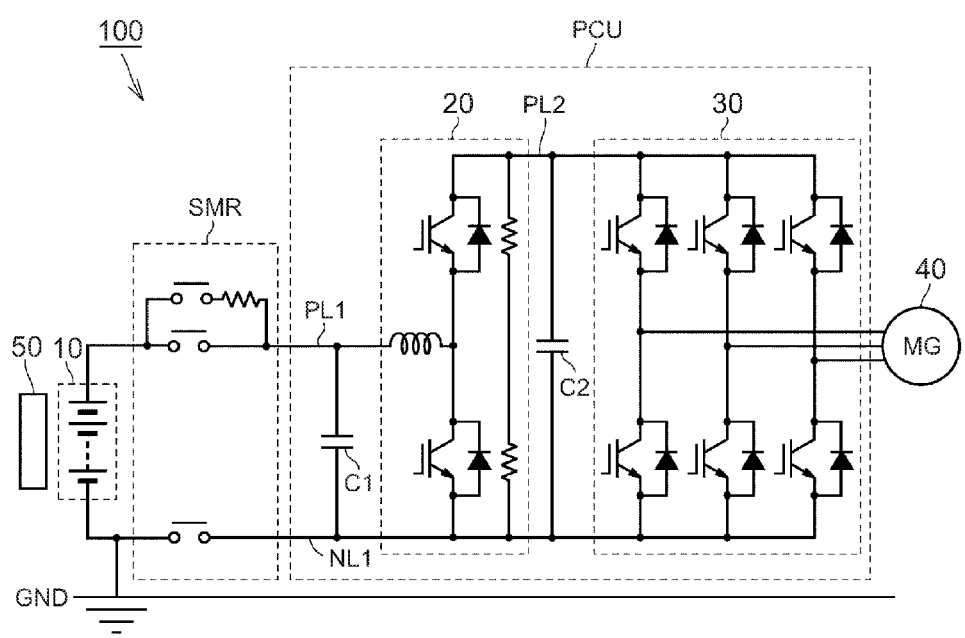
FIG. 1 is a schematic configuration diagram of a hybrid vehicle.

A description will hereinafter be made with reference to the drawings. Where the same component and a corresponding component are denoted by the same reference numerals, an overlapping description will not be repeated.

A hybrid vehicle 100 will be described with reference to FIG. 1 based on the inventor's concepts. The hybrid vehicle 100 includes an engine, which is not shown, a battery 10, a system main relay SMR, a drive section PCU, a rotary electric machine 40, and a battery sensor 50.

The battery 10 is constructed of a secondary battery, such as a lithium-ion battery. The battery 10 is charged when receiving power that is generated in conjunction with actuation of the engine or electric power from outside of the vehicle. The system main relay SMR includes: a relay that is inserted between portions of a power line PL1; and another relay that is inserted between portions of a ground line NL1. These relays electrically connect/disconnect the battery 10 and/from the drive section PCU when receiving a signal from a controller.

The drive section PCU converts DC power from the battery 10 into AC power for driving the rotary electric machine 40. The drive section PCU can also convert the AC power that is generated by the rotary electric machine 40 into the DC power for charging the battery 10. More specifically, the drive section PCU includes a converter 20, capacitors C1, C2, and an inverter 30.

The converter 20 conducts bidirectional DC voltage conversion between a power line PL2 and the battery 10 by switching control. The capacitor C1 is connected between the power line PL1 and the ground line NL1, and the capacitor C2 is connected between the power line PL2 and the ground line NL1. The inverter 30 conducts bidirectional electric power conversion between the DC power, which is between the power line PL2 and the ground line NL1, and the AC power that is input/output to/from the rotary electric machine 40.

The rotary electric machine 40 generates drive power when receiving the AC power from the drive section PCU. The drive power is transmitted to a drive wheel, which is not shown, and the hybrid vehicle 100 thereby travels. During regenerative braking, the rotary electric machine 40 generates the electric power by a rotary force of the drive wheel. The generated electric power is converted into charging electric power by the drive section PCU and is supplied to the battery 10. The battery sensor 50 detects information on a battery voltage and the like of the battery 10, and a detection value by the battery sensor 50 is sent to the controller, which is not shown. Hereinafter, the battery sensor 50 in the will be described with reference to FIG. 2.

The battery sensor 50 measures information on the battery 10, such as the battery voltage of the battery 10. A state of charge (SOC) of the battery 10 can be computed when a charged/discharged current, a battery temperature, and the like are measured in addition to the battery voltage, for example. The controller that is mounted in the vehicle controls the system main relay SMR (FIG. 1), the converter 20 (FIG. 1), and the inverter 30 (FIG. 1) on the basis of various types of the information on the battery 10, such as the battery voltage of the battery 10. In this way, charging and discharging of the battery 10 are controlled.

Figure 2:
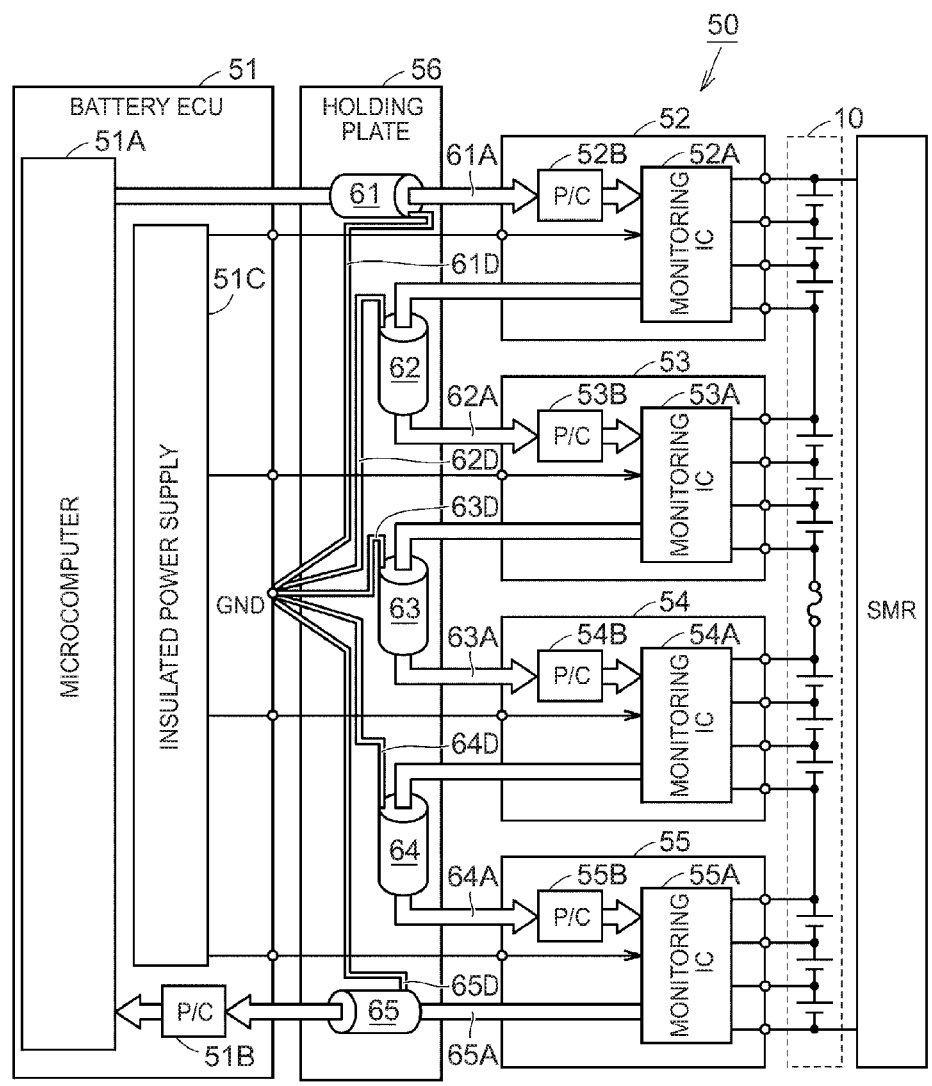
FIG. 2 is a diagram of a function block of a battery sensor (a communication system)

FIG. 2 is a diagram that is centered on a battery ECU 51 for measuring the battery voltage of the battery 10 and the like of a function block provided in the battery sensor 50. A holding plate 56 is also shown in FIG. 2. The holding plate 56 is constructed of metallic members such as a case and an attachment bracket. The holding plate 56 does not have a function of conducting a particular control operation, such as input/output of a signal or the electric power thereto/therefrom. However, for convenience of the description, the holding plate 56 is shown in FIG. 2 that shows the function block of the battery sensor 50.

As shown in FIG. 2, the battery 10 is configured by electrically connecting plural battery blocks in series. The battery sensor 50 includes the battery ECU 51 as a low-voltage system, voltage measurement modules 52 to 55 as high-voltage systems, shielded wires 61 to 65, and the holding plate 56.

The battery ECU 51 includes a microcomputer 51A, an insulated power supply 51C, and a connector 51B. The voltage measurement modules 52 to 55 respectively include monitoring ICs 52A to 55A and connectors 52B to 55B. The monitoring ICs 52A to 55A are supplied with drive electric power from the insulated power supply 51C. The monitoring ICs 52A to 55A are respectively connected to a positive-electrode side terminal and a negative-electrode side terminal of the battery blocks and each measure inter-terminal voltages. The microcomputer 51A of the battery ECU 51 gathers the inter-terminal voltages (voltage information) that are measured by the monitoring ICs 52A to 55A.

More specifically, the microcomputer 51A is electrically connected to the monitoring IC 52A via the shielded wire 61 and the connector 52B. The monitoring IC 52A is electrically connected to the monitoring IC 53A via the shielded wire 62 and the connector 53B. The monitoring IC 53A is electrically connected to the monitoring IC 54A via the shielded wire 63 and the connector 54B. The monitoring IC 54A is electrically connected to the monitoring IC 55A via the shielded wire 64 and the connector 55B. The monitoring IC 55A is electrically connected to the microcomputer 51A via the shielded wire 65 and the connector 51B.

That is, the microcomputer 51A and the voltage measurement modules 52 to 55 (the monitoring ICs 52A to 55A) are connected in series via the shielded wires 61 to 65 and constitute one closed circuit. The microcomputer 51A outputs a command signal to each of the voltage measurement modules 52 to 55 through the shielded wire 61. Meanwhile, the microcomputer 51A receives input of a response signal to the command signal from each of the voltage measurement modules 52 to 55 through the shielded wire 65.

Here, the shielded wire 61 mainly transmits the command signal (a low-voltage signal) that is related to activation of the voltage measurement modules 52 to 55. Meanwhile, the shielded wires 62 to 65 not only respectively transmit the command signals (the low-voltage signals) that are related to the activation of the voltage measurement modules 53 to 55 but also respectively transmit signals (high-voltage signals) that are related to the voltages measured by the voltage measurement modules 52 to 55. The voltage information is sequentially transmitted to the voltage measurement modules 52 to 55, and the transmitted voltage information is gathered in the microcomputer 51A.

Figure 3:
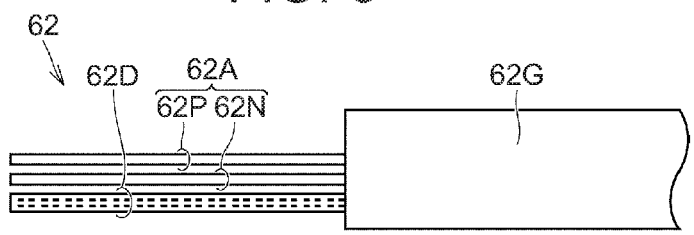
FIG. 3 is a side view of a shielded wire that is used for the battery sensor.
Figure 4:
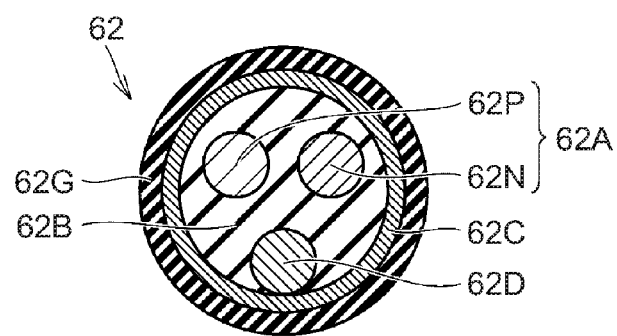
FIG. 4 is a cross-sectional view of the shielded wire that is used for the battery sensor.

The shielded wires 61 to 65 (FIG. 2) have substantially the same configuration. A description will be made on the configurations of the shielded wires 61 to 65 while focusing on the shielded wire 62, and the description on the shielded wires 61, 63 to 65 will not be repeated. FIG. 3 and FIG. 4 are a side view and a cross-sectional view of the shielded wire 62, respectively.

As shown in FIG. 3 and FIG. 4, the shielded wire 62 has a wire section 62A, an insulator 62B (FIG. 4), a shielding layer 62C (FIG. 4), a drain wire 62D, and a sheath 62G. The wire section 62A includes paired core wires 62P, 62N. The shielding layer 62C (a first shielding layer) is constructed of a braided metal tube and a metal foil tape and covers the wire section 62A (the core wires 62P, 62N) via the insulator 62B. The sheath 62G covers a periphery of the shielding layer 62C, and a portion of the shielding layer 62C is removed to expose the drain wire 62D to the outside.

With reference to FIG. 2 again, the shielded wires 61, 63, 64, 65 have substantially the same configuration as the shielded wire 62. The shielded wires 61, 63, 64, 65 respectively include wire sections 61A, 63A, 64A, 65A, each of which corresponds to the wire section 62A, and drain wires 61D, 63D, 64D, 65D, each of which corresponds to the drain wire 62D. Each of the wire sections 61A to 65A is schematically shown in FIG. 2 by using one arrow. Each of the wire sections 61A to 65A includes paired core wires that correspond to the core wires 62P, 62N (FIG. 3, FIG. 4).

The wire sections 61A to 65A of the shielded wires 61 to 65 connect the microcomputer 51A and the monitoring ICs 52A to 55A in series and can each function as a communication line. Meanwhile, the drain wires 61D to 65D of the shielded wires 61 to 65 are each grounded. The drain wires 61D to 65D are connected to a body of the hybrid vehicle 100 (FIG. 1) and the like, for example.

Figure 5:
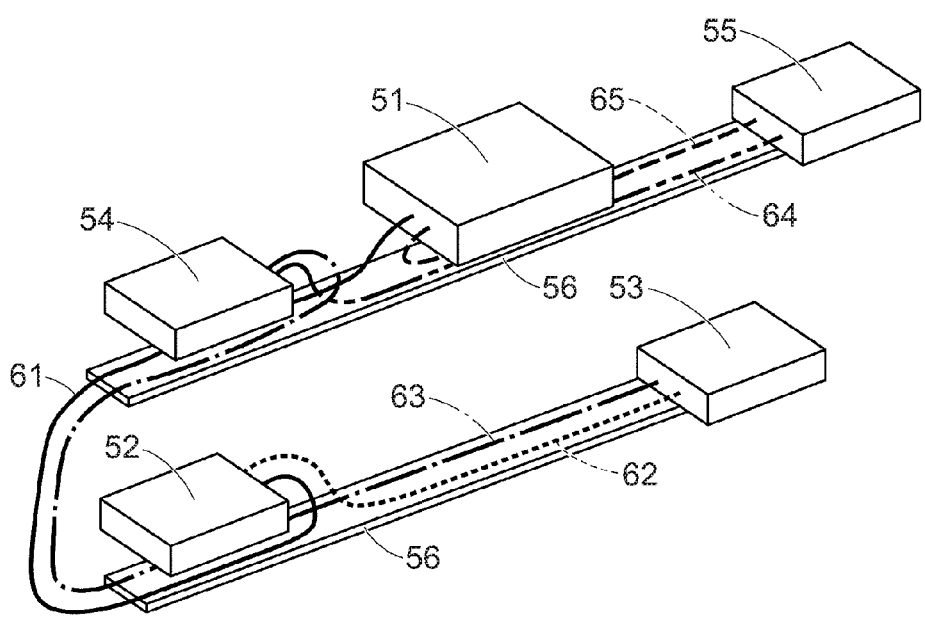
FIG. 5 is a perspective view for schematically showing one example of an arrangement configuration of a battery ECU of the battery sensor, a voltage measurement module, the shielded wire, and a holding plate.

FIG. 5 is a perspective view for schematically showing one example of an arrangement configuration of the battery ECU 51, the voltage measurement modules 52 to 55, the shielded wires 61 to 65, and the holding plate 56. As described above, the battery ECU 51 and the voltage measurement modules 52 to 55 are connected in series by the shielded wires 61 to 65. For convenience of illustration, the shielded wire 61 is shown by a solid line, the shielded wire 62 is shown by a dotted line, the shielded wire 63 is shown by a one-dot chain line, the shielded wire 64 is shown by a two-dot chain line, and the shielded wire 65 is shown by a broken line.

As described above, the shielded wire 61 mainly transmits the command signal (the low-voltage signal) that is related to the activation of the voltage measurement modules 52 to 55. That is, the shielded wire 61 conducts low-voltage communication. The shielded wires 62 to 65 not only respectively transmit the command signals (the low-voltage signals) that are related to the activation of the voltage measurement modules 53 to 55 but also respectively transmit the signals (the high-voltage signals) that are related to the voltages measured by the voltage measurement modules 52 to 55. That is, the shielded wires 62 to 65 each conduct high-voltage communication.

Each of the shielded wires 61 to 65 is arranged near the metallic holding plate 56. The holding plate 56 is constructed of metallic members such as the case and the attachment bracket. That is, the shielded wires 62 to 65, which conduct the high-voltage communication, are arranged near the shielded wire 61 as one of the low-voltage system and the holding plate 56.

Figure 6:
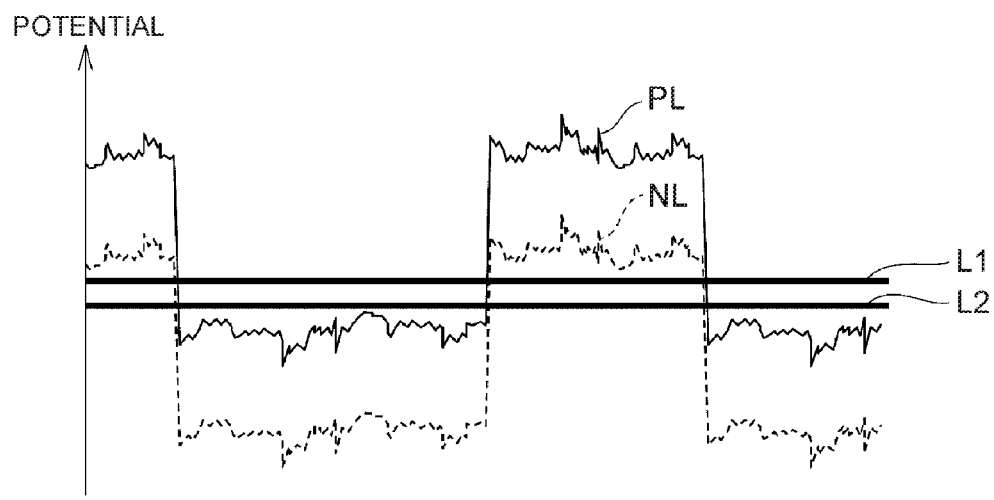
FIG. 6 is a chart of a situation where a potential during communication in the battery sensor is seen with low-voltage wiring as a reference.

FIG. 6 shows a situation where a potential during communication is seen with low-voltage wiring (the shielded wire 61) as a reference. As indicated by lines L1, L2, when seen with the low-voltage wiring (the shielded wire 61) as the reference, a potential in the low-voltage communication has a substantially constant value near 12 V, for example. On the other hand, as indicated by lines PL, NL, when seen with the low-voltage wiring (the shielded wire 61) as the reference, a potential in the high-voltage communication varies.

Figure 7:
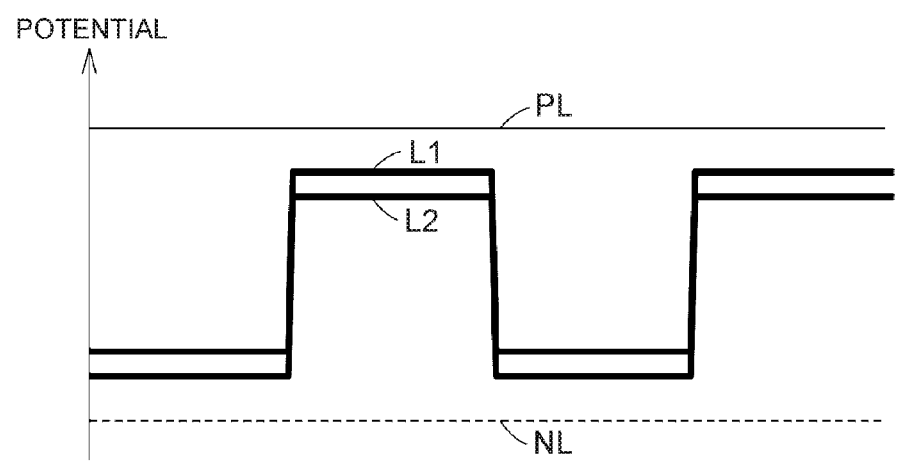
FIG. 7 is a chart of a situation where the potential during the communication in the battery sensor is seen with high-voltage wiring as a reference.

FIG. 7 shows a situation where the potential during the communication is seen with high-voltage wiring (the shielded wires 62 to 65) as a reference. As indicated by the lines PL, NL, when seen with the high-voltage wiring (the shielded wires 62 to 65) as the reference, the potential in the high-voltage communication has a substantially constant value. On the other hand, as indicated by the lines L1, L2, when seen with the high-voltage wiring (the shielded wires 62 to 65) as the reference, the potential in the low-voltage communication varies.

As shown in FIG. 6 and FIG. 7, when the voltage measurement modules 52 to 55 (the high-voltage systems) are driven, a large potential variation difference (300V to 400V, for example) is generated between the high-voltage wiring and the low-voltage wiring (a ground potential).

While a situation where such a large potential variation difference is generated exists, each of the shielded wires 61 to 65 is arranged near the metallic holding plate 56 (see FIG. 5). That is, the shielded wire 61 as the one of the low-voltage system and the holding plate 56 as a low-voltage structure body are located near the shielded wires 62 to 65 for conducting the high-voltage communication.

Figure 8:
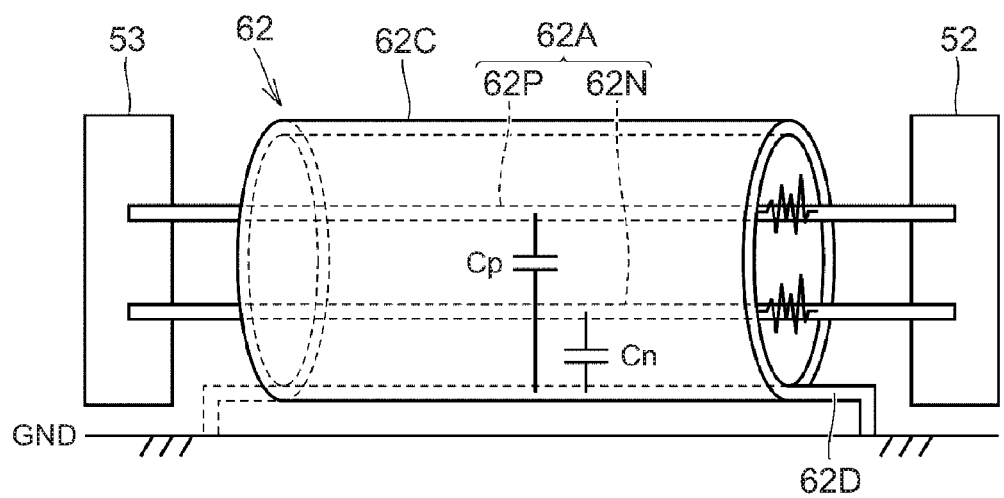
FIG. 8 is a view for schematically showing a situation where the communication is conducted in the battery sensor.

A description will be made on an operation and an effect with reference to FIG. 8. While the following description focuses on the shielded wire 62, the same applies to the shielded wires 63 to 65 (see FIG. 2).

As described above, the shielded wire 62 (the wire section 62A) connects the voltage measurement modules 52, 53 as the high-voltage systems. The shielding layer 62C of the shielded wire 62 is grounded to a body GND or the like via the drain wire 62D. Because the shielding layer 62C is provided to cover the wire section 62A, noise that is generated in the high-voltage communication stays on the inside of the shielding layer 62C. Thus, the low-voltage systems (the shielded wire 61 and the like) are hardly influenced by the noise that is generated in the high-voltage communication, and communication performance of the low-voltage wiring can be secured.

However there is a possibility that communication performance of the high-voltage communication does not function normally. More specifically, stray capacitances Cp, Cn are formed between the wire section 62A (the core wires 62P, 62N) and the shielding layer 62C. The potential variation difference that is generated between a communication reference wire of the high-voltage wiring and the low-voltage wiring (the ground potential) is possibly superposed as the noise on the high-voltage wiring via the stray capacitances Cp, Cn, and thus the high-voltage communication does not possibly function normally.

Figure 9:
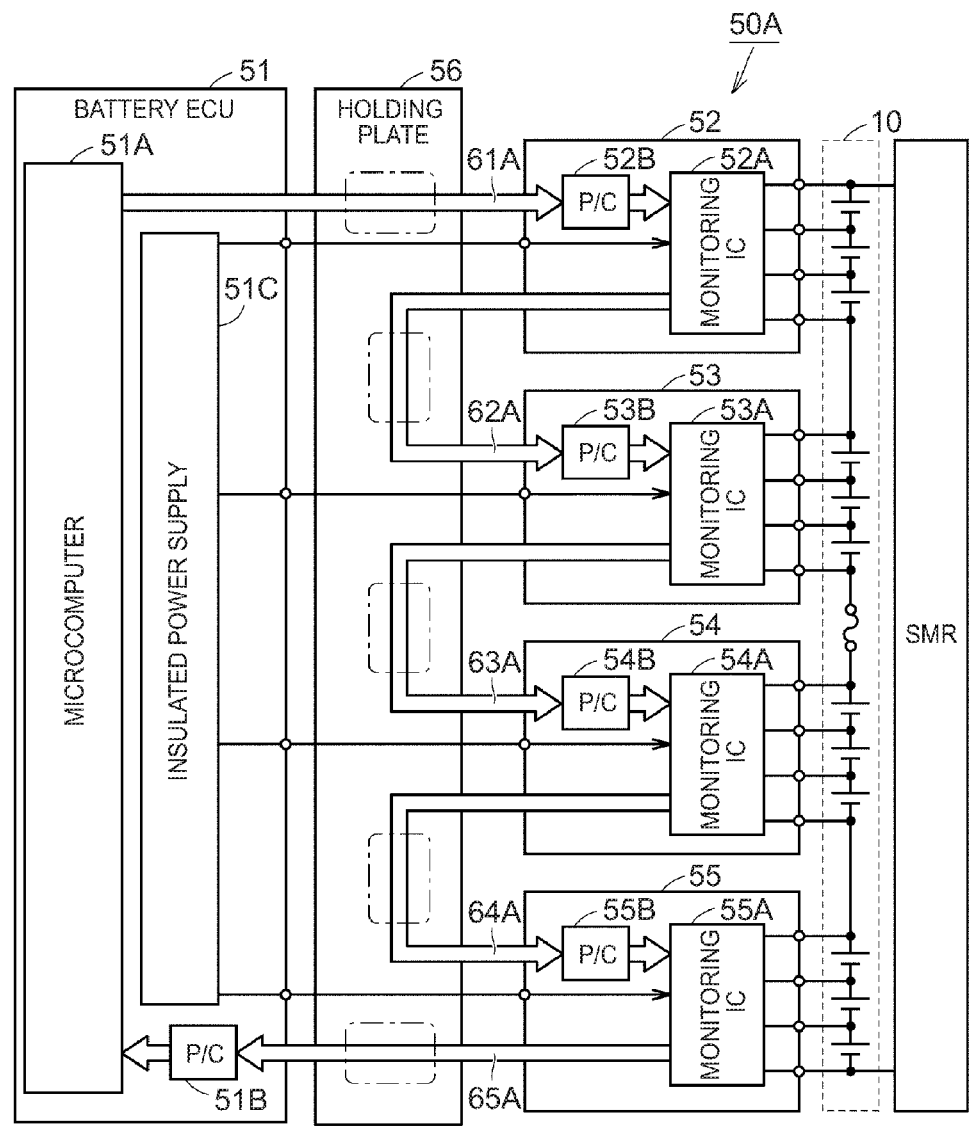
FIG. 9 is a diagram of a function block of a battery sensor (a communication system)

A battery sensor 50A will be described with reference to FIG. 9. FIG. 9 is a diagram that is centered on the battery ECU 51 for measuring the battery voltage of the battery 10 and the like of a function block provided in the battery sensor 50A.

Differing from the above description, the microcomputer 51A and the monitoring ICs 52A to 55A are connected only by the wire sections 61A to 65A. That is, in Reference Art 2, ground connection that uses the drain wires 61D to 65D (see FIG. 2) is not made (see regions indicated by one-dot chain lines in FIG. 9).

Figure 10:
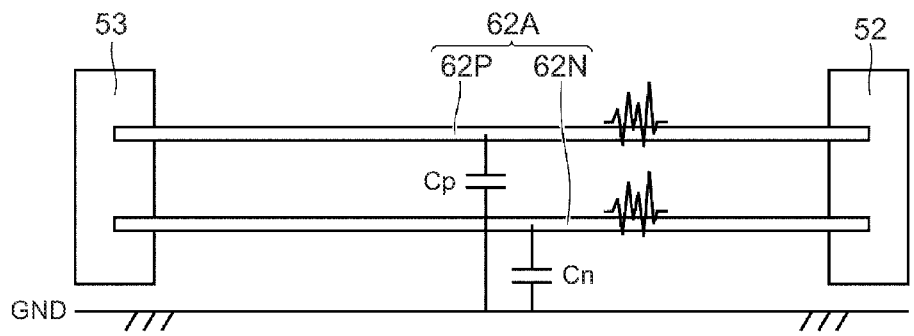
FIG. 10 is a view for schematically showing a situation where communication is conducted in the battery sensor.

With reference to FIG. 10, the stray capacitances Cp, Cn are formed between the wire section 62A (the core wires 62P, 62N) and the ground potential (the body GND). The potential variation difference that is generated between the communication reference wire of the high-voltage wiring and the low-voltage wiring (the ground potential) is possibly superposed as the noise on the high-voltage wiring via the stray capacitances Cp, Cn, and thus the high-voltage communication does not possibly function normally.

Not limited to the above, high-voltage noise that is generated in the wire section 62A spreads peripherally and influences the low-voltage systems (the shielded wire 61 and the like). In order to obtain an anti-noise property only from separation by routing, a sufficient distance has to be secured between the high-voltage wiring and the low-voltage wiring (or the ground potential), and consequently this leads to enlargement of a device.

In addition, a measure of adding a noise filter is also considered. However, the addition of the noise filter leads to the enlargement of the device and also leads to other concerns of cost, cracking of the noise filter (a ferrite core), and the like. Furthermore, the addition of the noise filter possibly interferes with improvement of precision of a communication signal and improvement of responsiveness.

In addition, a measure of bringing the signal used for the high-voltage communication to be low-voltage is also considered. However, in order to bring the signal to be low-voltage, a low-voltage power supply has to be incorporated in the high-voltage system in addition to addition of elements such as a photocoupler and a transformer. Thus, another problem of routing, the enlargement of the device, a problem in terms of the cost are possibly raised.

A description will hereinafter be made on an embodiment with reference to the drawings. The same components or corresponding components to those discussed above are denoted by the same reference numerals and an overlapping description will not be repeated.

Figure 11:
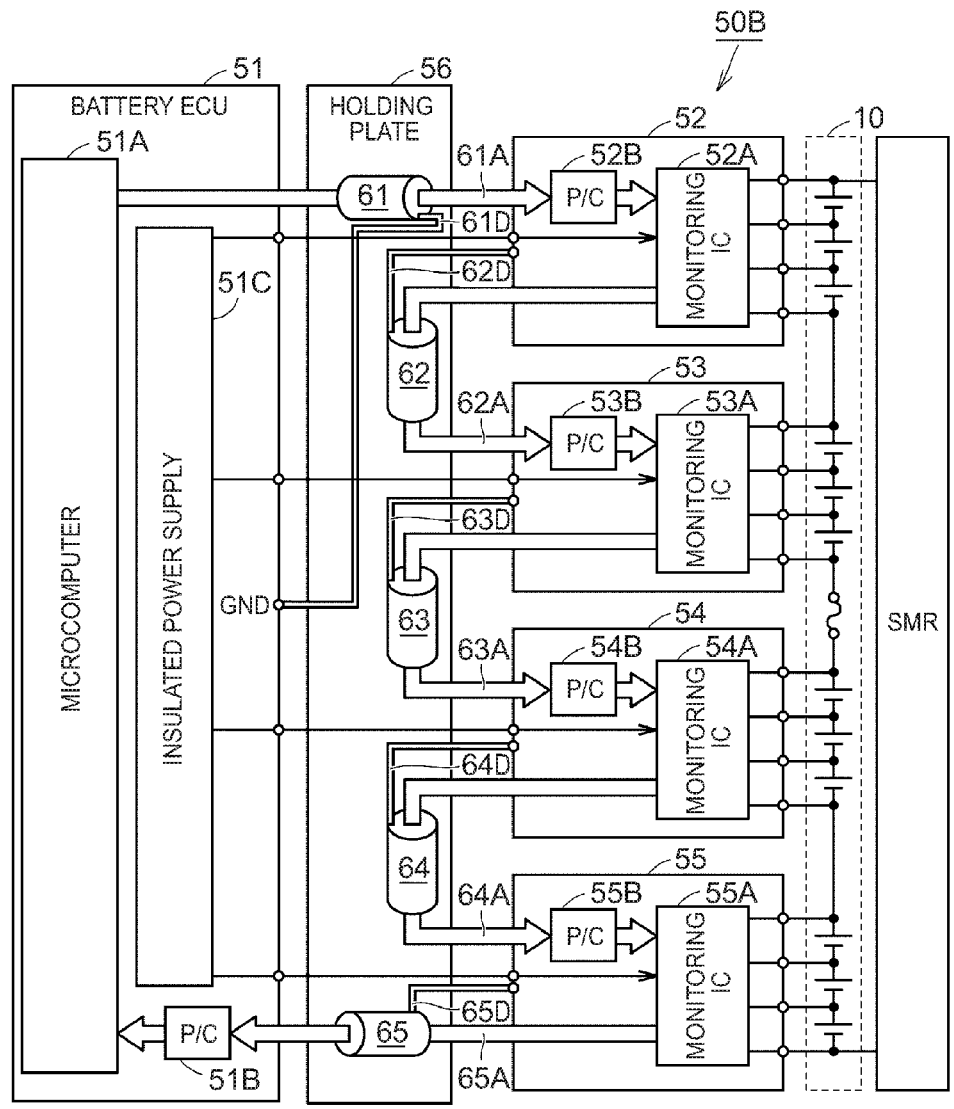
FIG. 11 is a diagram of a function block of a battery sensor (a communication system) in an embodiment.

A battery sensor 50B in the embodiment will be described with reference to FIG. 11. FIG. 11 is a diagram that is centered on the battery ECU 51 for measuring the battery voltage of the battery 10 and the like of a function block provided in the battery sensor 50B. The embodiment differs from FIG. 2 in a point that the drain wires 62D to 65D of the shielded wires 62 to 65 are grounded to the high-voltage system. That is, the drain wires 62D to 65D in the embodiment are not grounded to the body GND.

More specifically, the drain wire 62D of the shielded wire 62 is grounded to the voltage measurement module 52. In this way, the shielding layer 62C (the first shielding layer) of the shielded wire 62 (see FIG. 12) is grounded to the same potential as the voltage measurement module 52 via the drain wire 62D. A line for securing a reference potential via the drain wire 62D preferably has as low impedance as possible.

Similarly, the drain wires 63D, 64D, 65D of the shielded wires 63 to 65 are respectively grounded to the voltage measurement modules 53, 54, 55. In this way, the shielding layers of the shielded wires 63, 64, 65 are respectively grounded to the same potentials as the voltage measurement modules 53, 54, 55. Also in a case of the shielded wires 63 to 65, it is preferred that lines for securing the reference potential via the drain wires 63D, 64D, 65D respectively have as low impedance as possible.

Figure 12:
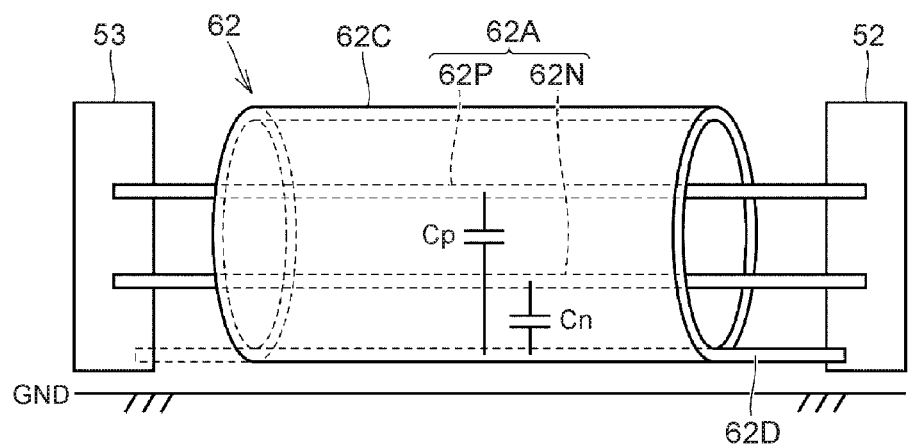
FIG. 12 is a view for schematically showing a situation where communication is conducted in the battery sensor of the embodiment.

A description will be made on an operation and an effect in the embodiment with reference to FIG. 12. While the following description focuses on the shielded wire 62, the same applies to the shielded wires 63 to 65 (see FIG. 11). An influence of the low-voltage communication on the high-voltage communication can be suppressed by grounding the shielding layer 62C to the high-voltage system (the voltage measurement module 52) via the drain wire 62D.

More specifically, the shielding layer 62C of the shielded wire 62 (the high-voltage wiring) that is connected to the voltage measurement module 52 (the high-voltage system) is grounded to the voltage measurement module 52 (the high-voltage system). In this way, the potential variation difference between the communication reference wire of the shielded wire 62 (the high-voltage wiring) and a shield ground section becomes smaller than the potential variation difference in the case where the ground connection of the shielding layer of the shielded wire 62 (the high-voltage wiring) is made.

Figure 13:
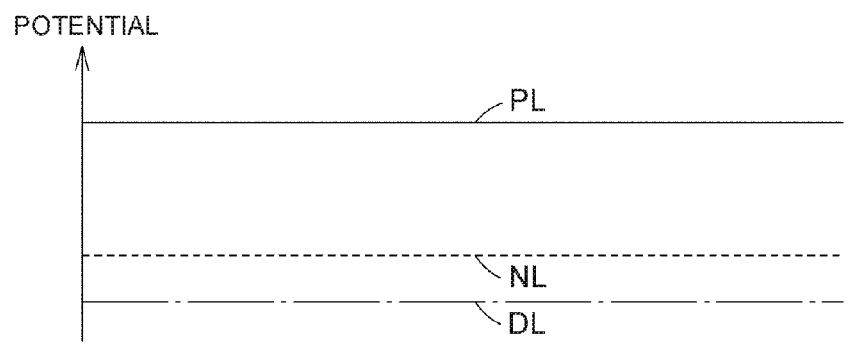
FIG. 13 is a chart of a potential during the communication (inside of a shielding layer) in the battery sensor of the embodiment.

FIG. 13 is a chart of a potential during the communication (on the inside of the shielding layer 62C) and shows a situation where the potential during the communication is seen from inside of the shielding layer 62C. As indicated by the lines PL, NL, when seen with a potential DL of the shielding layer 62C as a reference, the potential in the high-voltage communication has a substantially constant value. Because the potential variation difference between the communication reference wire of the shielded wire 62 (the high-voltage wiring) and the shield ground section becomes smaller, the noise that is generated as a result of the potential variation difference is suppressed, and the noise is hardly superposed on the high-voltage wiring.

Not limited to the configuration as described above, a similar effect can be obtained when an object that forms the same potential as that of the voltage measurement module 52 is available and the shielding layer 62C (see FIG. 12) of the shielded wire 62 is grounded to the object instead of the voltage measurement module 52 itself.

Figure 14:
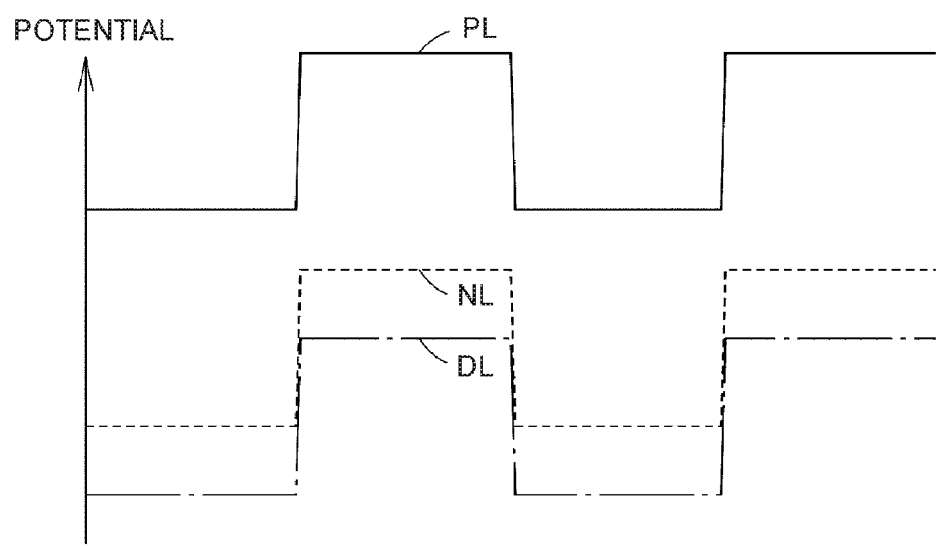
FIG. 14 is a chart of the potential during the communication (outside of the shielding layer) in the battery sensor of the embodiment.

FIG. 14 is a chart of a potential during the communication (on the outside of the shielding layer 62C) and shows a situation where the potential during the communication is seen from the outside of the shielding layer 62C. In the case where a configuration for grounding the shielding layer 62C to the high-voltage system (the voltage measurement module 52, for example) is adopted, the noise that is generated in the high-voltage system is likely to spread to the outside of the shielding layer 62C. As a measure against this, a configuration that will be described in a following first modified example (FIG. 15 and FIG. 16) is preferably adopted.

A description will hereinafter be made on modified examples of the embodiment with reference to FIG. 15 to FIG. 21. In the following description, only different points of each of the modified examples from the embodiment will be described, and an overlapping description will not be repeated.

Figure 15:
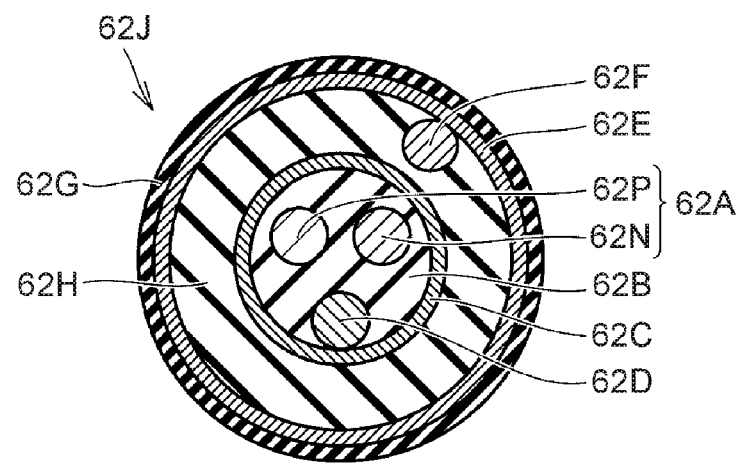
FIG. 15 is a cross-sectional view of a shielded wire that is used in a first modified example of the embodiment.

FIG. 15 is a cross-sectional view of a shielded wire 62J that is used in the first modified example of the embodiment. In addition to the wire section 62A, the insulator 62B, the shielding layer 62C (the first shielding layer), the drain wire 62D, and the sheath 62G, the shielded wire 62J further includes an insulator 62H, a shielding layer 62E (a second shielding layer), and a drain wire 62F.

The shielding layer 62E is constructed of the braided metal tube and the metal foil tape and covers the shielding layer 62C via the insulator 62H. The sheath 62G covers a periphery of the shielding layer 62E, and a portion of the shielding layer 62E is removed to expose the drain wire 62F to the outside.

Figure 16:
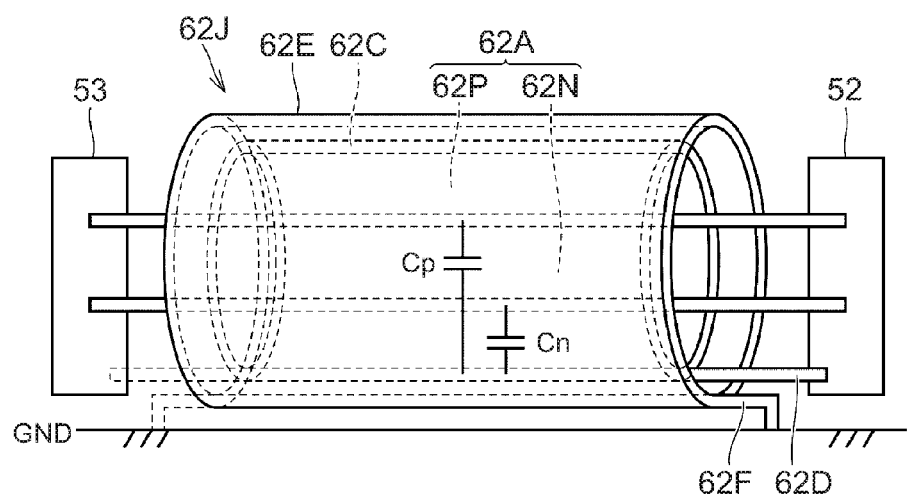
FIG. 16 is a view for schematically showing a situation where communication is conducted in a battery sensor of the first modified example of the embodiment.

As shown in FIG. 16, the shielding layer 62E is grounded to the low-voltage system or a portion with the same potential as the low-voltage system (the body GND or the like, for example) via the drain wire 62F. According to this configuration, not only the noise that spreads from the low-voltage system side to the high-voltage system side but also the noise that spreads from the high-voltage system side to the low-voltage system side can be suppressed. A line for securing the ground potential via the drain wire 62F preferably has as low impedance as possible.

Figure 17:
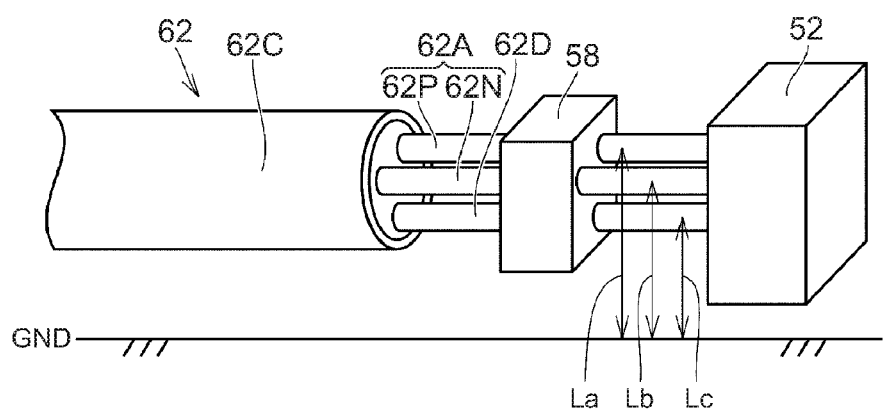
FIG. 17 is a side view of a shielded wire and a clamp that are used in a second modified example of the embodiment.

With reference to FIG. 17, it is preferably configured that portions of the wire section 62A (the core wires 62P, 62N) and the drain wire 62D that are not shielded (portions that are not covered with the shielding layer 62C) are held by a clamp 58 and the like and that each of distances La, Lb, Lc from the core wires 62P, 62N and the drain wire 62D to the body GND has a constant value.

Figure 18:
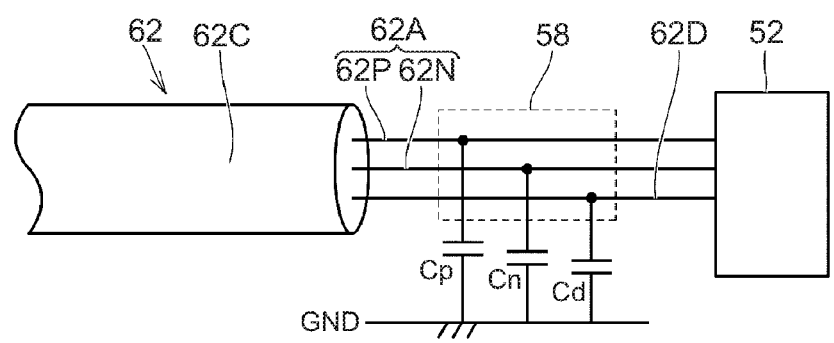
FIG. 18 is a view for schematically showing a situation where communication is conducted in a battery sensor of the second modified example of the embodiment.
Figure 19:
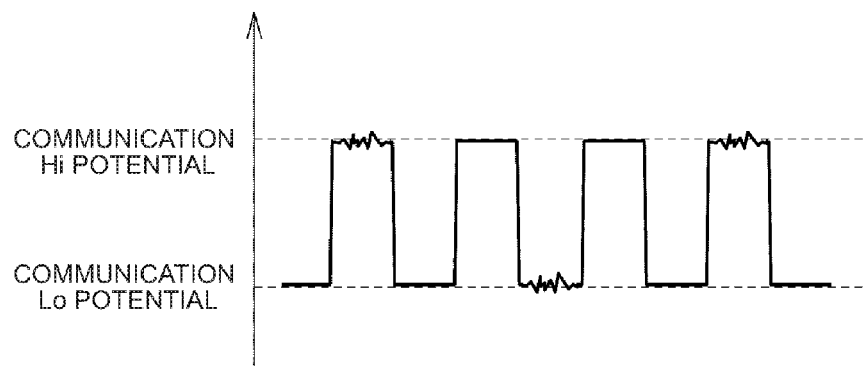
FIG. 19 is a chart of a potential during the communication in the battery sensor of the second modified example of the embodiment.

With reference to FIG. 18, according to said configuration, the core wires 62P, 62N and the drain wire 62D that have a potential difference in unshielded portions have a constant insulation distance (or a noise coupling suppression distance). That is, a relationship of $Cp \cong Cn \cong Cd$ is established for values of the stray capacitances, and the noise in the same level is superposed on the core wires 62P, 62N and the drain wire 62D. As a result, such a stable communication waveform as shown in FIG. 19 can be obtained.

Here, it may be configured that each of the distances La, Lb, Lc has the constant value not by the clamp 58 but by using a molding resin, a tape, or the like. A relationship of $Cp \cong Cn$ may be established instead. In FIG. 18, the drain wire 62D is arranged at an end position among the three wires. However, a further greater effect can be expected if the position of the drain wire 62D is changed to a middle position.

Such a configuration can also be implemented by being combined with the above first modified example. That is, in the case where the shielded wire 62J (FIG. 15, FIG. 16) is used, it is preferably configured that the portions of the wire section 62A (the core wires 62P, 62N) and the drain wire 62D that are not shielded (the portions that are not covered with the shielding layer 62C) are held by the clamp 58 and the like and that each of the distances from the core wires 62P, 62N and the drain wire 62D to the body GND (or the shielding layer 62E) has the constant value.

Figure 20:
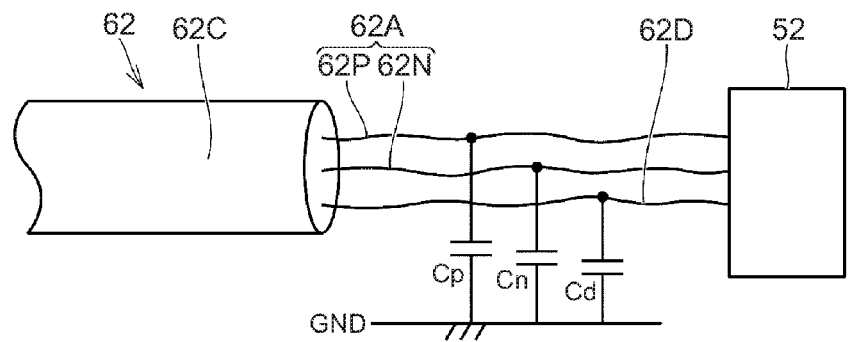
FIG. 20 is a view for schematically showing a situation where communication is conducted in a battery sensor of a comparative example of the second modified example of the embodiment.
Figure 21:
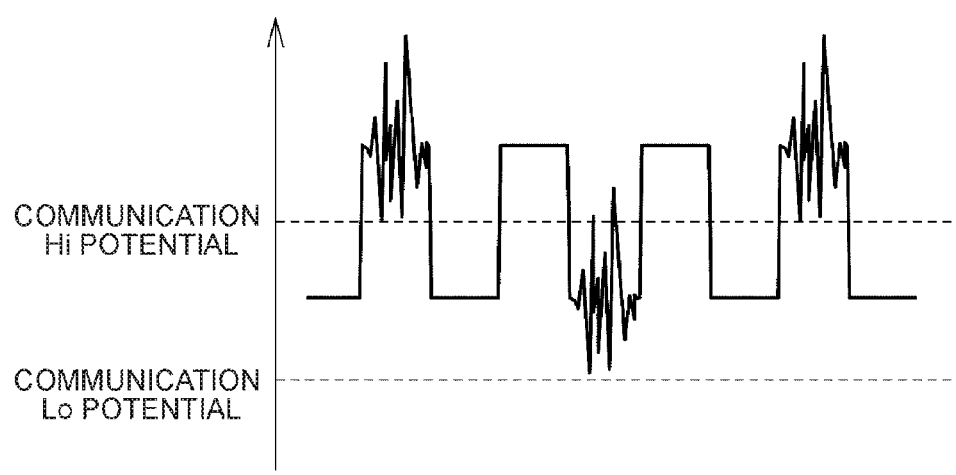
FIG. 21 is a chart of a potential during the communication in the battery sensor of the comparative example of the second modified example of the embodiment.

With reference to FIG. 20, if it is not configured that each of the distances La, Lb, Lc from the core wires 62P, 62N and the drain wire 62D to the body GND has the constant value, a relationship of $Cp \neq Cn \neq Cd$ is likely to be established for the values of the stray capacitances. The noise in different levels is superposed on the core wires 62P, 62N and the drain wire 62D. As a result, such an unstable communication waveform as shown in FIG. 21 is obtained.

The above-described embodiment and each of the modified examples are described on the basis of the battery sensor (the communication system) in the hybrid vehicle and an attachment structure of the shielded wire that is provided in the battery sensor. The above-described embodiment and the modified examples can be applied to all of the high-voltage system and the low-voltage system that have different potential references and potential variations and an influence of which on each other is not desired.

For example, the above-described embodiment and the modified examples can effectively be applied to a case where signal communication is superposed on the high-voltage wiring in a Programmable Logic Controller (PLC) communication of the hybrid vehicle. The above-described embodiment and the modified examples can also be applied to a case where an influence between the high-voltage wiring and the low-voltage wiring used for a consumer power supply (a household appliance) or a vehicle is suppressed in a plug-in hybrid vehicle.

Alternatively, the above-described embodiment and the modified examples can also be applied to a case where the influence between the high-voltage wiring and the low-voltage wiring used for the consumer power supply (the household appliance) or the vehicle is suppressed in a smart grid. In addition to the vehicle, the above-described embodiment and the modified examples can also be applied to the PLC of a communication system of an electric power company and the like other than the vehicle.

A description has been made so far on the embodiment and the modified example. However, what has been disclosed above is merely illustrative in all aspects and not restrictive. A technical scope of the present disclosure is indicated by the claims, and is intended to include all changes that fall within the equivalent meaning and scope to the claims.

What is claimed is:

1. A shielded wire, the shielded wire connected to a high-voltage system and conducting high-voltage communication, the shielded wire comprising:
   a wire section;
   a first shielding layer that covers the wire section, the first shielding layer being grounded to the high-voltage system or an object with the same potential as the high-voltage system; and a second shielding layer that covers the first shielding layer, the second shielding layer being grounded to a low-voltage system or an object with the same potential as the low-voltage system.

2. A communication system comprising:
a high-voltage system;
a low-voltage system arranged near the high-voltage system; and
a shielded wire connected to the high-voltage system and including a wire section and a first shielding layer, the first shielding layer covers the wire section and being grounded to the high-voltage system or an object with the same potential as the high-voltage system, wherein
the shielded wire further includes a second shielding layer that covers the first shielding layer, and the second shielding layer is grounded to the low-voltage system or an object with the same potential as the low-voltage system.

3. The shielded wire according to claim 1, wherein
the wire section including plural wires, that each of distances from each wires to the low-voltage system or the object with the same potential as the low-voltage system having a constant value.

4. The shielded wire according to claim 3, wherein
the plural wires being at least a first core wire, a second core wire and a drain wire, the drain wire being in a middle position of the core wires.

5. The shielded wire according to claim 1, wherein
the high-voltage system is applied to a high-voltage wiring in Programmable Logic Controller (PLC) communication of the hybrid vehicle.

6. The shielded wire according to claim 1, wherein
the high-voltage system and the low-voltage system are applied to a consumer power supply.

7. The shielded wire according to claim 1, wherein
the high-voltage system and the low-voltage system are applied to a smart grid.

8. The communication system according to claim 2, wherein
the shielded wire including plural wires, each of the wires having a same distance to the low-voltage system or to the object with the same potential as the low-voltage system.

9. The communication system according to claim 8, wherein
the plural wires being at least a first core wire, a second core wire and a drain wire, the drain wire being in a middle position of the core wires.

10. The communication system according to claim 2, wherein
the high-voltage system is applied to the high-voltage wiring in PLC communication of the hybrid vehicle.

11. The communication system according to claim 2, wherein
the high-voltage system and the low-voltage system are applied to a consumer power supply.

12. The communication system according to claim 2, wherein
the high-voltage system and the low-voltage system are applied to a smart grid.

* * * * *